United States Patent
Peter

(10) Patent No.: US 12,000,874 B2
(45) Date of Patent: Jun. 4, 2024

(54) METHOD FOR MEASURING ELECTRICAL CURRENTS AND VOLTAGES, AND ENERGY METER

(71) Applicant: Roland Bürger, Buchholz (DE)

(72) Inventor: Mathias Peter, Buchholz (DE)

(73) Assignee: Roland Bürger, Buchholz (DE)

(*) Notice: Subject to any disclaimer, the term of this patent is extended or adjusted under 35 U.S.C. 154(b) by 110 days.

(21) Appl. No.: 17/775,010

(22) PCT Filed: Sep. 23, 2020

(86) PCT No.: PCT/DE2020/100820
§ 371 (c)(1),
(2) Date: May 6, 2022

(87) PCT Pub. No.: WO2021/089077
PCT Pub. Date: May 14, 2021

(65) Prior Publication Data
US 2022/0365120 A1    Nov. 17, 2022

(30) Foreign Application Priority Data
Nov. 7, 2019   (DE) ................. 10 2019 129 992.6

(51) Int. Cl.
*G01R 22/10*    (2006.01)
(52) U.S. Cl.
CPC ................... *G01R 22/10* (2013.01)
(58) Field of Classification Search
CPC ................. G01R 15/18; G01R 22/10
USPC ........................................... 702/61
See application file for complete search history.

(56) References Cited

U.S. PATENT DOCUMENTS

| | | |
|---|---|---|
| 9,817,053 B2 | 11/2017 | Krüger |
| 2003/0088374 A1 | 5/2003 | Slater |
| 2003/0151415 A1 | 8/2003 | Randall |
| 2012/0221278 A1 | 8/2012 | Cook |
| 2015/0137596 A1 | 5/2015 | Steiner-Jovic |

FOREIGN PATENT DOCUMENTS

EP   2787357 A1   10/2014

OTHER PUBLICATIONS

Sato et al., JP 2016058634A, Date published: Apr. 21, 2016, "Current transformer". (Year: 2016).*
International Search Report dated Feb. 2, 2021, PCT/DE2020/100820, 3 pages.

* cited by examiner

*Primary Examiner* — John H Le
(74) *Attorney, Agent, or Firm* — LUCAS & MERCANTI, LLP; Klaus P. Stoffel

(57) ABSTRACT

A method for measuring electric currents and a method for measuring electrical voltages. The method uses a mathematical model of the measuring system to compensate for error effects of the real system compared to an ideal system, thereby enabling a highly accurate measuring system. An energy meter compensates for the error effects of the real measuring system.

22 Claims, 6 Drawing Sheets

FIG.3a

| Transmission errors in percent | | | | | | | |
|---|---|---|---|---|---|---|---|
| Curent value measured on the output side [A] | Actual secondary current [A] taking into account the transmission error @ 2.5 VA | Nominal secondary current [A] @ 2.5 VA | $I_p[\% I_{pr}]$ | 15VA [%] | 10VA [%] | 5VA [%] | 2,5VA [%] |
| 1.20468 | 1.20468 | 1.2 | 120 | -0.44 | -0.15 | 0.13 | 0.37 |
| 1.0039 | 1.0039 | 1 | 100 | -0.47 | -0.16 | 0.12 | 0.37 |
| 0.50195 | 0.50195 | 0.5 | 50 | -0.59 | -0.26 | 0.06 | 0.38 |
| 0.20078 | 0.20078 | 0.2 | 20 | -0.82 | -0.40 | 0.01 | 0.39 |
| 0.10039 | 0.10039 | 0.1 | 10 | -0.95 | -0.47 | -0.01 | 0.39 |
| 0.050195 | 0.050195 | 0.05 | 5 | -1.02 | -0.50 | -0.02 | 0.39 |
| 0.010039 | 0.010039 | 0.01 | 1 | -1.08 | -0.52 | -0.03 | 0.39 |

FIG.3b

| Phase errors in [min] at % of the rated current | | | | | | |
|---|---|---|---|---|---|---|
| Curent value measured on the output side [A] | Actual secondary current [A] taking into account the transmission error @ 2.5 VA | $I_p[\% I_{pr}]$ | 15VA [min] | 10VA [min] | 5VA [min] | 2,5VA [min] |
| 1.20468 | 1.20468 | 120 | 24 | 17.8 | 10.63 | 7.2 |
| 1.0039 | 1.0039 | 100 | 25 | 18 | 10.83 | 7.3 |
| 0.50195 | 0.50195 | 50 | 25.6 | 18.5 | 11.494 | 7.4 |
| 0.20078 | 0.20078 | 20 | 26 | 19 | 12.556 | 7.5 |
| 0.10039 | 0.10039 | 10 | 30 | 20 | 13 | 8 |
| 0.050195 | 0.050195 | 5 | 45 | 30 | 20 | 14 |
| 0.010039 | 0.010039 | 1 | 70 | 50 | 40 | 30 |

FIG.8b

The measurement device corrects the secondary signal coming from the converter in amplitude and phase using the corresponding error curve and the associated correction factor.

The converter measurement value is highly accurate in interaction with the electronics of the measurement device. The specification of an accuracy class for the converter is no longer absolutely necessary. Only the storage location of the respective file is required.

The measurement signal of the converter corresponds in terms of accuracy to the tolerance of the testing device used in the accuracy testing.

US 12,000,874 B2

METHOD FOR MEASURING ELECTRICAL CURRENTS AND VOLTAGES, AND ENERGY METER

CROSS-REFERENCE TO RELATED APPLICATIONS

The present application is a 371 of International application PCT/DE2020/100820, filed Sep. 23, 2020, which claims priority of DE 10 2019 129 992.6, filed Nov. 7, 2019, the priority of these applications is hereby claimed and these applications are incorporated herein by reference.

BACKGROUND OF THE INVENTION

The invention relates to a method for measuring electric currents, with the magnitude and phase of an electric current being measured using an inductive current converter.

In addition, the invention relates to a method for measuring electrical voltages, with the magnitude and phase of an electrical voltage being measured using an inductive voltage converter.

In addition, the invention relates to an energy meter using which the power consumption of a consumer or a large number of consumers can be measured over a period of time.

Methods of this type for measuring electric currents or voltages are used, for example, in the field of energy meters to determine the energy consumption of companies or households. In the following text, the term energy meter always also includes design variants of other electrical measuring devices for carrying out current and/or voltage measurements, for example protective relays.

When measuring the electric current, current converters are often used, using which a primary current of large magnitude is transformed into a secondary current of smaller magnitude, such that simpler and more cost-effective measuring means are able to be used. From a physical point of view, the current converters considered here are transformers that are operated in the near-short-circuit range. These are therefore inductive measuring converters whose task is to transmit currents proportionally and in phase so that they are able to be detected by measuring devices at a low potential.

The measurement accuracy of the measuring system is of considerable importance, particularly in the case of an energy meter application. The current converter has a decisive influence on the measurement accuracy of the energy meter. The selection of suitable current converters is based in this case on the current state of the art according to the classes defined in the IEC 61869-1/2 standard, for which certain class accuracies are specified. In this case, the maximum deviations in magnitude and phase are specified for the classes as a function of the applied current as a percentage of the rated current. The deviation is defined here and also in the context of this document as the deviation of the actually measurable secondary current in comparison with the ideal secondary current of the measuring system, which without further deviation in magnitude and without phase shift corresponds to the secondary current transformed from the primary current flowing through a primary conductor according to the turns ratio of the current converter.

In addition to the primary method, a common measuring method for ascertaining the accuracy of a current converter is the secondary voltage method. The secondary voltage method, which is also referred to as the model-based measuring method, is based on measurements made from the secondary side of the current converter. The secondary voltage method is now listed in the IEC 61869-2 standard as an alternative measurement. The values of the components of an equivalent circuit diagram of the current converter can be determined from several measurements using the secondary voltage method and a mathematical model of the current converter can thus be generated.

Real current converters exhibit iron losses in the core of the transformer and losses in the copper windings that lead to a deviation in the secondary variable compared to an ideal current converter.

In order to achieve the specified class accuracies for high-precision current converters, the current converters are optimized through the selection and design of the materials used, in particular the core material of the transformer and the cross-section of the copper cables. For this purpose, for example, low-loss iron materials such as nickel-iron are used and the cross-sections of the copper cables of the windings and/or the cross-section of the core are increased, as a result of which the costs for such high-precision current converters are significantly increased.

In addition, the transmission behavior of the current converters is not linear over the measuring range, with the result that significant deviations in the measurement result occur, especially in the case of small or very large primary currents.

A possible correction factor, such as that specified in the international standard for current sensors, for example, is not suggested or defined. This is due to the fact that current converters do not behave linearly from 0 A to the specified rated current. The error values are also very much dependent on the burden of the current converter, which is usually given by the input impedance of the measuring device and the resistance of the supply line. This varies from measuring device to measuring device. The impedance of the supply line, which primarily depends on the length and cross-section of the line, also varies from system to system. For these reasons, the use of a single correction factor to compensate for the current converter-induced measurement errors in the measuring device is not practical.

The dependency of the error values on the burden also denotes a special feature of inductive current converters with a current signal to be measured as the output signal compared to inductive voltage converters with a voltage signal to be measured as the output signal. This is because, for current or voltage sensors with a voltage signal to be measured as the output signal, the only requirements to limit the measurement error are a minimum impedance of the measurement input (for example 20 kOhm for current sensors and 200 kOhm for voltage sensors) from which the secondary signal of the sensors is no longer influenced, with the result that the detection of correction factors for such sensors is significantly easier.

The accuracies of the measuring converters tested by the manufacturers of corresponding inductive measuring converters according to normative specifications at specified burdens (for example at 25% and at 100% of the nominal burden) also do not allow any direct conclusions to be drawn about the error values for deviating burdens.

SUMMARY OF THE INVENTION

One object of the invention is to specify a method for measuring electric currents that enables improved measurement accuracy over a wide range of values for the primary current.

According to the invention, this object is achieved by a method for measuring electric currents.

Another object of the invention is to specify a method for measuring electrical voltages that enables improved measurement accuracy over a wide range of values for the primary voltage.

According to the invention, this object is achieved by a method for measuring electrical voltages.

Another object of the invention is to specify an energy meter using which a precise measurement of the current is also possible for less precise current converters.

According to the invention, this object is achieved by an energy meter.

The features of a method for measuring electric currents disclosed below are part of the invention both individually and in all executable combinations.

A method according to the invention for measuring electric currents uses at least one inductive current converter to determine at least one electric current flowing through at least one primary conductor, wherein the at least one current converter has a primary side and a secondary side which is DC-isolated from the primary side. The current on the secondary side is measured using a measuring apparatus.

The method according to the invention for measuring electric currents uses a measuring system which has at least one current converter, a measuring apparatus and a connecting line between the secondary side of the current converter and a current measurement input of the measuring apparatus, with the measuring system being able to be used to determine the current flowing through at least one primary conductor.

The deviations in magnitude and phase of the secondary-side current caused by the electrical structure of the real measuring system compared to an ideal system are compensated for in a method according to the invention for measuring electric currents using a mathematical model of at least the current converter.

The mathematical model of a current converter is given here by an electrical equivalent circuit diagram of the current converter and the values of the electrical components of the equivalent circuit diagram.

In a preferred embodiment of the invention, an electrical equivalent circuit diagram of the current converter that is as precise as possible with regard to the interconnection of the electrical components and their values is used.

In a preferred embodiment of a method according to the invention for measuring electric currents, the electrical equivalent circuit diagram or the model of the current converter is used to determine the deviation of the measured current from the ideal secondary current in magnitude and phase as a function of the measured current.

In a particularly preferred embodiment of a method according to the invention, the model of the current converter also takes into account the actual burden on the current converter in terms of the input impedance of the measuring apparatus and/or the line resistance of the line from the current converter to the measuring apparatus.

For this purpose, the mathematical model of the current converter has additional values for the input impedance of the measuring apparatus and/or the line resistance of the line from the current converter to the measuring apparatus.

In one embodiment of a method according to the invention, the model of the current converter is stored in a readable digital file.

In one embodiment of a method according to the invention, the model of the current converter is stored in an XML file, in an XLS file, in a CSV file or in a comparable file format.

In a preferred embodiment of the method according to the invention for measuring electric currents, this is designed as a method for compensating for at least one current converter for an energy meter.

In one embodiment of the invention, such a measuring system or method according to the invention for measuring electric currents is designed to measure the primary currents of 1 to 3 phases, that is to say the currents on 1 to 3 primary lines, with a current converter being provided for each phase. However, in embodiments of the invention, the measurement is also possible for more than three phases.

In one embodiment of the invention, in one method step, the model of the at least one current converter used in a measuring system is transmitted to the measuring apparatus of the measuring system using a transmission apparatus.

In one embodiment of the invention, the model of the current converter for a defined operating temperature can be stored in a memory device of the measuring apparatus and retrieved.

In one embodiment of the invention, the operating temperature for which the model of the current converter is stored is around 20° C.

In another embodiment of the invention, the model of the current converter for a plurality of defined operating temperatures is stored in a storage apparatus of the measuring apparatus and can be retrieved, such that it is also possible to compensate for temperature-dependent error influences.

In one embodiment of a method according to the invention for measuring electric currents, the type of current converter used is read out using a transmission apparatus when the measuring system is installed. For this purpose, the current converters of one type have a unique coding. This coding may be the serial number, for example, which can also be printed on the housing of the current converter in the form of a barcode or a QR code. In one method step, this coding is read out using the transmission apparatus or entered into it.

Furthermore, the coding of a current converter can also contain a manufacturer identification.

In one embodiment of the method according to the invention, the transmission device is used to retrieve the mathematical model of the respective current converter using the coding from a database stored on a server or web server via a suitable interface.

In a particularly preferred embodiment of the invention, the coding printed on the housing of the current converter contains, in addition to the serial number or a corresponding identification code, additionally or exclusively a link for downloading the model of the current converter from the Internet.

In one embodiment of the method according to the invention, the mathematical model of the current converter retrieved using the transmission apparatus is transmitted to the measuring apparatus via a suitable interface.

In one embodiment of the method according to the invention, the mathematical model of the current converter is supplemented with data relating to the line impedance of the line between current converter and measuring apparatus and/or the input impedance of the measuring apparatus using the transmission apparatus.

In one embodiment, the transmission apparatus is designed as a smartphone, a tablet or as a PC with suitable software installed on the transmission apparatus.

In another embodiment of the method according to the invention, the mathematical model of the current converter is supplemented with data relating to the line impedance of the line between current converter and measuring apparatus and/or the input impedance of the measuring apparatus directly at the transmission apparatus.

For example, the measuring apparatus has suitable input means for this purpose, which are used for the method according to the invention in the corresponding embodiment.

In another embodiment of the invention, the mathematical model of the current converter is automatically supplemented with at least the input impedance of the measuring apparatus on the measuring apparatus.

In another embodiment of the invention, even before the transmission to the measuring apparatus, the mathematical model of the current converter has values for the line impedance of the line between current converter and measuring apparatus and/or the input impedance of the measuring apparatus.

In one embodiment of the invention, standard values are stored for this purpose in the mathematical model of the current converter.

In a preferred embodiment of the invention, at least the input impedance of the measuring apparatus is specified based on the measuring apparatus actually used, for example by automatically selecting it from a predefined list based on the serial number of the measuring apparatus or the energy meter or the selection of the measuring apparatus used or the energy meter used. In addition, it is also possible to transmit a measured input impedance of the measuring apparatus and to supplement the mathematical model with this transmitted value.

The line impedance of the line between the current converter and the measuring apparatus can be supplemented by transferring a measured line impedance, by selecting from a predefined list or by using the value automatically calculated from an input of the line length and the cross section.

The mathematical model of the current converter can be supplemented with the line impedance of the line between the current converter and the measuring apparatus and/or the input impedance of the measuring apparatus at the storage location of the mathematical model of the current converter from which it can be retrieved, or can be implemented on the transmission apparatus.

In embodiments of the invention, the mathematical model of the current converter and possibly the input impedance of the measuring apparatus and/or the line impedance of the line between current converter and measuring apparatus is stored in a storage device in the measuring apparatus.

If a current measurement is carried out using the measuring system, in one embodiment of the method according to the invention, the mathematical model of the at least one current converter for measuring electric currents is loaded from the storage device and the measurement deviation of the at least one measured current from the secondary current of the ideal measuring system is compensated for using the mathematical model.

In another embodiment of a method according to the invention for measuring electric currents, the mathematical model of the at least one current converter, preferably supplemented by the data of the respective supply line and the input impedance of the measuring apparatus, is used in order to calculate a compensation table therefrom. In this case, the entire compensation table or only parts of the compensation table can be created first.

In one embodiment of a method according to the invention, the compensation table is generated using the transmission apparatus and only the compensation table is transmitted to the measuring apparatus without a mathematical model of the current converter.

The compensation table used in embodiments of the invention provides for a secondary current measured on the secondary side of the respective current converter as a function of a previously specified rated power of the current converter on the basis of the mathematical model of the current converter, preferably supplemented with the data on the supply line and/or the input impedance of the measuring apparatus, the absolute value and/or the phase of the ideal secondary-side current, such that the actual primary-side current can be deduced from this using the turns ratio of the current converter. The specified rated power is determined here by the resistance of the supply line and the measuring device.

In another embodiment of a method according to the invention for measuring electric currents, the compensation table for a secondary current measured on the secondary side of the respective current converter directly indicates the actual magnitude and/or the actual phase of the primary-side current as a function of a previously specified rated power of the current converter on the basis of the mathematical model of the current converter, preferably supplemented with the data of the supply line impedance and the input impedance of the measuring apparatus.

In one embodiment of the invention, instead of the discrete values of the measured secondary current, the respective RMS value of the measured secondary current is used to compensate for and calculate the primary current.

Since the error values in the compensation table are also specified as RMS values in a preferred embodiment of the method, the RMS values derived from the measurements can then be corrected.

In contrast, in an alternative embodiment, the individual sampled values of the secondary current are corrected individually, for example in the corresponding time interval used for the RMS value calculation.

In order to calculate the power consumption of at least one consumer connected to the at least one primary line, in one embodiment of the invention, the RMS values of current and voltage are multiplied for a 50 Hz oscillation. In another embodiment of the method, the discrete values of current and voltage are individually multiplied at the sampling times.

By way of the features disclosed above, a method according to the invention for measuring electric currents enables the use of cost-effective current converters, since larger errors are also compensated for using the mathematical model of the current converter.

Using a method according to the invention for measuring electric currents, high-precision measuring systems can be implemented over a wide operating range.

The measurement error of the method according to the invention depends on the accuracy of the model of the current converter and the data of the supply line and/or the input impedance of the measuring apparatus possibly added to the model.

When the method according to the invention is used for measuring electric currents in an energy meter, a voltage measurement usually also takes place in addition to the current measurement. In the case of medium-voltage and high-voltage applications, this voltage is not measured directly, but converted to a lower voltage range via a voltage converter. As a rule, voltage converters are used from around 1000 V upwards.

In a preferred embodiment of the invention, the method for measuring electric currents in an energy meter is therefore supplemented with an analogously implemented compensation method for the at least one electrical voltage measured in addition to the at least one electric current.

To this end, in one embodiment of the invention, a mathematical model of at least one voltage converter used is installed on the measuring apparatus and used when measuring at least one electrical voltage directly or in the form of a generated compensation table to compensate for the at least one measured electrical voltage.

In a further embodiment of the method according to the invention, the compensation table for compensating for the at least one electrical voltage is generated using the transmission apparatus and transmitted to the measuring apparatus.

In a preferred embodiment of a method according to the invention, for each phase an electric current is measured using a current converter and an electrical voltage is measured using a voltage converter and each compensated for based on the mathematical models of the current or voltage converters used, preferably supplemented by the data of the respective supply lines to the measuring apparatus as well the input impedances of the measuring apparatus at the current and at the voltage measuring input.

The features of an energy meter according to the invention disclosed below are part of the invention both individually and in all executable combinations.

An energy meter according to the invention has at least one measuring apparatus which is designed to measure at least one electric current and at least one electrical voltage per phase of a line for electric current.

In one embodiment, the energy meter according to the invention has a memory device for storing the mathematical model of at least one current converter connected to the energy meter and/or the associated compensation table and, in a preferred embodiment, also for storing the mathematical model of at least one voltage converter connected to the energy meter and/or the associated compensation table.

In a preferred embodiment, the energy meter according to the invention has an interface for transmitting the data of the at least one mathematical model of the connected current and/or voltage converter(s) and/or the associated compensation tables to the energy meter.

In one embodiment of the invention, the at least one current measured on the secondary side can be compensated using the energy meter in relation to the error caused by the respective current converter in connection with the impedance of the respective supply line and the input impedance of the respective current measurement input of the measuring apparatus.

In a preferred embodiment of the invention, the at least one voltage measured on the secondary side can also be compensated for using the energy meter in relation to the error caused by the respective voltage converter in connection with the impedance of the respective supply line and the input impedance of the respective voltage measurement input of the measuring apparatus.

In one embodiment of the invention, the energy meter has a compensation unit for this purpose, using which the respective measured variable can be compensated for based on the mathematical model of the respective current or voltage converter.

In a preferred embodiment of the invention, the respective measured variable can be compensated for by way of the compensation unit of the energy meter using a respectively assigned compensation table.

In one embodiment of the invention, the features of the method for measuring electric currents disclosed above, from detection of the coding of the current and/or voltage converter up to installing the mathematical model or models of the converter or converters, are part of a separate method for installing a mathematical model of a current converter on a measuring apparatus.

Such a method according to the invention for installing a mathematical model of a current converter on an energy meter is characterized in that, in one method step, a type-related coding of a current converter connected to an energy meter or to be connected to said energy meter is read out using a transmission apparatus, in that, in a further method step, a mathematical model of the respective current converter is downloaded from a web server onto the transmission apparatus using the coding read out, in that, in a further method step, the mathematical model of the respective current converter is transmitted to the energy meter via an interface, and in that the mathematical model of the current converter is stored in a memory device of the energy meter in a further method step.

With regard to the characteristics of the coding of the current converter, reference is made to the above description of the method according to the invention for measuring electric currents.

In another embodiment of a method according to the invention for installing a mathematical model of a current converter on an energy meter, this is further characterized in that the mathematical model of the current converter can be supplemented, using the transmission apparatus, with the impedance of the line between the current converter and the energy meter and/or the input impedance of the measuring apparatus of the energy meter.

In a further embodiment of the method according to the invention, the mathematical model of a current converter can be supplemented directly at the energy meter with the impedance of the supply line and/or the input impedance of the measuring apparatus of the energy meter.

In another embodiment of a method according to the invention for installing a mathematical model of a current converter on an energy meter, this is also characterized in that the mathematical model of the current converter is stored in a digital file.

In another embodiment of a method according to the invention for installing a mathematical model of a current converter on an energy meter, this is also characterized in that the type-related coding of the current converter contains a download link for downloading the mathematical model of the current converter.

In one embodiment of a method according to the invention for installing a mathematical model of a current converter on an energy meter, the mathematical model of the current converter is downloaded from a web server via an Internet connection.

In a preferred embodiment of a method according to the invention for installing a mathematical model of a current converter on an energy meter, the mathematical model of the current converter is generated using the secondary voltage method.

In a particularly preferred embodiment, the method according to the invention for installing a mathematical model of a current converter on an energy meter is supplemented with an analog-implemented method for installing a mathematical model of a voltage converter on an energy meter.

In preferred embodiments of a method according to the invention for measuring electric currents and a method according to the invention for measuring electrical voltages, the impedance of the supply line and/or the input impedance of the measuring apparatus is first determined and transmitted to the web server using the transmission apparatus. In connection with the data for identifying the current converter or voltage converter used, which is also transmitted to the web server using the transmission apparatus, the respective mathematical model of the current converter or voltage converter is supplemented on the web server with the impedance of the supply line and/or the input impedance of the measuring apparatus and generates a compensation table adapted to the respective combination of current converter or voltage converter, measuring apparatus or energy meter and, if necessary, the line between current converter or voltage converter and measuring apparatus. This individual compensation table is then transmitted from the web server to the transmission apparatus, from which it is transmitted to the energy meter via an interface and stored in a memory device of the energy meter.

The transfer of the generated compensation table instead of the mathematical model to the energy meter allows the use of energy meters with lower computing power, since the compensation table does not have to be generated on said energy meter.

In further embodiments of the method according to the invention for measuring electric currents and a method according to the invention for measuring electrical voltages, the mathematical models of the current converters or voltage converters are not stored on a web server but on a local PC or the transmission apparatus itself and are selected on this using the detected type designation of the current converter or voltage converter.

If the mathematical models are stored on a local PC, the detected type designation of the current converter or voltage converter, possibly in connection with the impedance of the supply line and/or the input impedance of the measuring apparatus, is transmitted by the transmission apparatus via a suitable interface such as USB, Bluetooth or WLAN, from the transmission device to the PC and the corresponding mathematical model or the corresponding compensation table generated on the PC from the mathematical model is transmitted from the PC to the transmission apparatus.

If the mathematical models are stored on the transmission apparatus, the corresponding mathematical model is selected on the transmission apparatus itself using the type designation of the current converter or voltage converter and, in embodiments of the method according to the invention, the corresponding compensation table is generated from the selected mathematical model on the transmission apparatus, with the mathematical model possibly supplemented by the impedance of the supply line and/or the input impedance of the measuring apparatus.

BRIEF DESCRIPTION OF THE DRAWING

The following drawings show exemplary embodiments of the methods according to the invention and an application example for an energy meter. In the drawings:

FIG. 3a: shows an exemplary compensation table for the current measured on the secondary side in relation to the magnitude of the current, FIG. 3b: shows an exemplary compensation table for the current measured on the secondary side in relation to the phase of the current, FIGS. 8a and 8b: show a schematic representation of the method for installing a mathematical model of a current or voltage converter on an energy meter.

DETAILED DESCRIPTION OF THE INVENTION

Figures 1, 2:
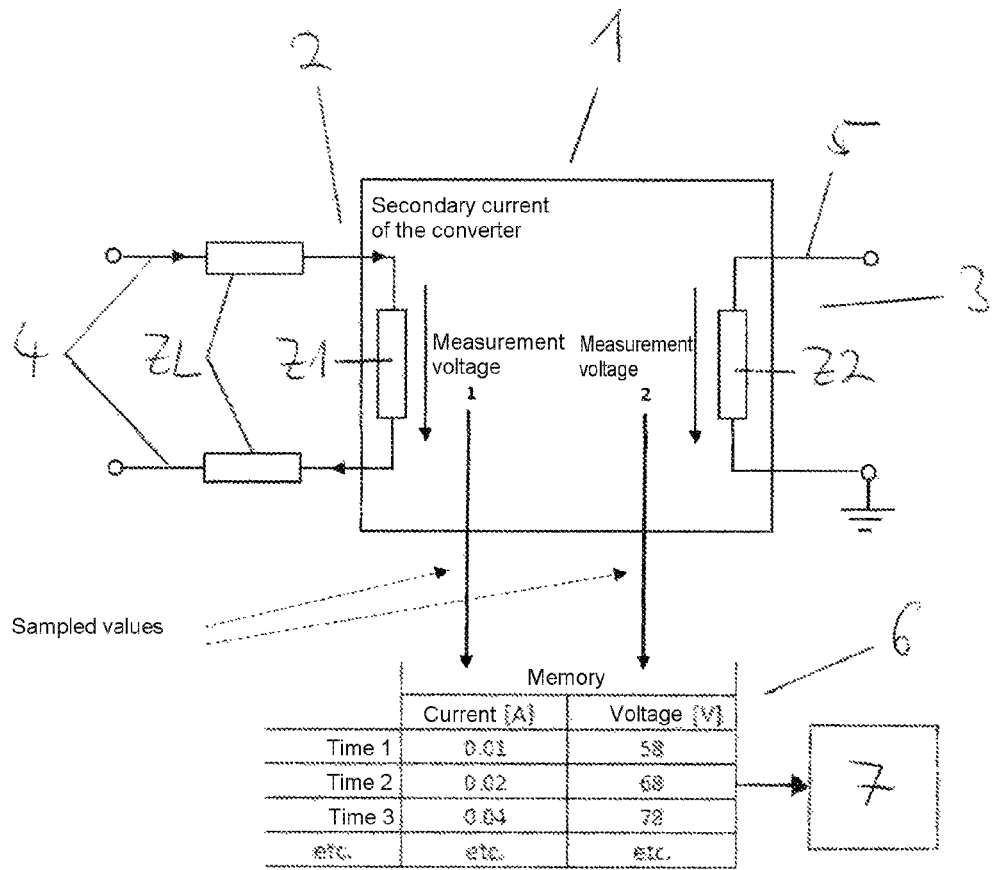
FIG. 1: shows a schematic representation of a measuring apparatus that can be used for a method according to the invention.
FIG. 2: shows a schematic representation of the electrical equivalent circuit diagram of a current converter.

FIG. 1 shows a schematic representation of the application example for a measuring apparatus (1) with a current measurement input (2) and a voltage measurement input (3), such as the measuring apparatus (1) of an energy meter (100), for example.

A first supply line (4) is connected to the current measurement input (2) with the input impedance Z1, via which supply line the current measurement input (2) can be connected to the secondary side of a current converter (10), not shown in this figure. On the primary side, the current converter (10) can be coupled to a primary line through which the current Ito be determined flows. A second supply line (5) is connected to the voltage measurement input (3) with the input impedance Z2, via which supply line the voltage measurement input (3) can be connected to the secondary side of a voltage converter (20), not shown in this figure. The primary side of the voltage converter (20) can be coupled to the primary line on which the voltage U to be determined is applied.

The measurement data for current and voltage detected using the measuring apparatus (1) can be stored at least temporarily using a memory device (6) so that the measurement data can be compensated for using the compensation unit (7) in order to determine the compensated primary variables I and U.

The input impedance Z1 of the current measurement input (2) is low. In the exemplary embodiment shown, the input impedance Z1 of the current measurement input (2) is 1 ohm. The supply line resistance ZL of the first supply line (4) is a total of 1.5 ohms (2×0.75 ohms). The input impedance Z2 of the voltage measurement input (3) is high and in the example is 10 MOhm.

FIG. 2 shows an electrical equivalent circuit diagram of a current converter (20) as an example of how the mathematical model of a current converter (20) is based in a method according to the invention.

The voltage $U_1$ is the primary voltage and the voltage $U_2$ is the secondary voltage of the current converter (20). The core voltage of the current converter (20) is denoted by $U_0$. The voltage across the secondary winding of the current converter (20) is denoted by $U_W$. Regarding the currents, $I_1$ denotes the primary current, $I_2$ the secondary current, $I_1'$ the ideally transformed primary current, $I_0$ the magnetizing current, $I_\mu$ the inductive component of the magnetizing current $I_0$ and $I_R$ the ohmic component of the magnetizing current $I_0$. $P_1$ and $P_2$ are used to denote the primary terminals, while $S_1$ and $S_2$ are used to denote the secondary terminals. $N_1$ denotes the number of primary turns and $N_2$ the number of secondary turns of the current converter (20). The turns ratio is given by $N_1/N_2$. $L_{2\sigma}$ denotes the secondary leakage inductance, $R_{CT}$ denotes the secondary winding resistance, $X_B$ denotes the inductive component of the burden impedance, $R_B$ denotes the resistive component of the burden impedance, $X_H$ denotes the main inductance of the core of the current converter (20) and $R_{Fe}$ denotes the resistance representing the iron losses of the current converter (20).

FIG. 3a shows an exemplary compensation table for compensating for the magnitude of the measured current, as used in a method according to the invention for measuring electric currents according to advantageous embodiments. In the course of designing the system, a rated power is specified for the current converter (20).

In an application example explained in detail below, the primary rated current is 100 A, the secondary rated current is 1 A, the rated power is 10 VA, the accuracy class of the current converter (20) is 0.5 and the rated frequency of the primary current is 50 Hz. The primary current to be detected is 10 A. The supply line resistance of the supply line (4) between the current converter (20) and the current measurement input (2) of the measuring apparatus (1) is twice 0.75 ohms and the input impedance Z1 of the current measurement input (2) is 1 ohm. According to the formula $P=I^2 \times R$, the rated power for the example current converter is then: (1 A)²×(2×0.75 ohm+1 ohm)=2.5 VA.

Based on the current value measured on the secondary side, which is 0.10039 A for example, and the rated power, which is 2.5 VA as calculated above in the example, the error value for the measured current value can be read from the compensation table shown. In the example, the nominal transmission ratio of the current converter (20) is 100:1, such that, from the compensated current value measured on the secondary side, which is quantified as 0.1 A after compensation for the error of 0.39%, it can be calculated at 10 A, which corresponds to the primary current actually currently flowing through the primary conductor according to the example.

FIG. 3b shows an analog compensation table for the phase error of the measured current. The phase error is compensated for here in the same way as for the compensation of the magnitude error, in that the phase error is read from the compensation table using the previously determined rated power and the measured current value.

Figure 4:
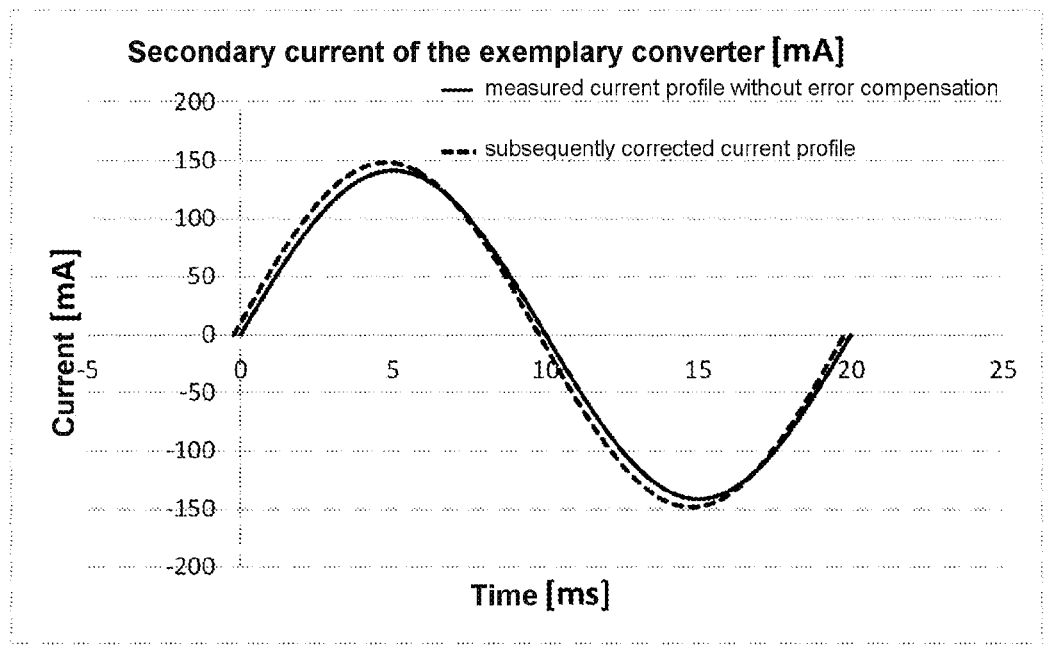
FIG. 4: shows a representation of the measured and the compensated secondary current.

FIG. 4 shows the sine waves of the secondary current of the current converter (20) from the example defined above. The profile of the actually measured secondary current and that of the subsequently compensated current signal are shown. The measured current signal was compensated for here in magnitude and phase using the compensation tables shown in FIGS. 3a and 3b.

Figure 5:
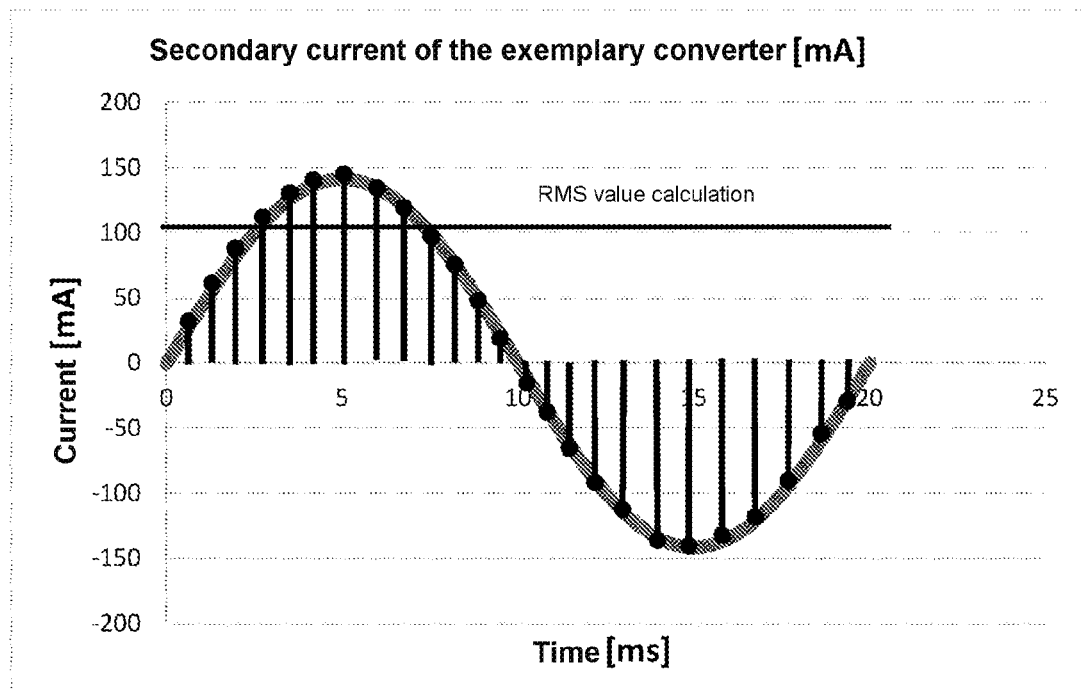
FIG. 5: shows a schematic representation of the metrological scanning of the secondary-side current signal.

FIG. 5 shows the actual treatment of the secondary current by the measuring apparatus (1). Using said measuring apparatus, the secondary current is sampled at discrete points in time, which are represented in the figure by the black lines with a circular head. The actual profile of the current can be reconstructed from the sampled values. A direct correction of the discrete sampled values is in this case not possible in embodiments of the invention since the current values are present as RMS values in the corresponding compensation tables. In order to then carry out a subsequent correction of the sampled values, the relevant RMS value is calculated in the measuring apparatus over a complete sinusoidal oscillation. For this purpose, the sampled values of the current measurement input (2) of the measuring apparatus (1) are stored with the associated sampled values of the voltage measurement input (3) using a storage apparatus (6). In other embodiments of the invention, the RMS value is estimated over a shorter interval. It is now possible to read from the compensation table, for example, that at an RMS value of the current measured on the secondary side of 0.10039 A and a rated power of 2.5 VA, there is ultimately a nominal secondary current of 0.1 A. The phase error or the compensation of the phase error must then be dealt with in the same way using the corresponding compensation table.

Figure 6:
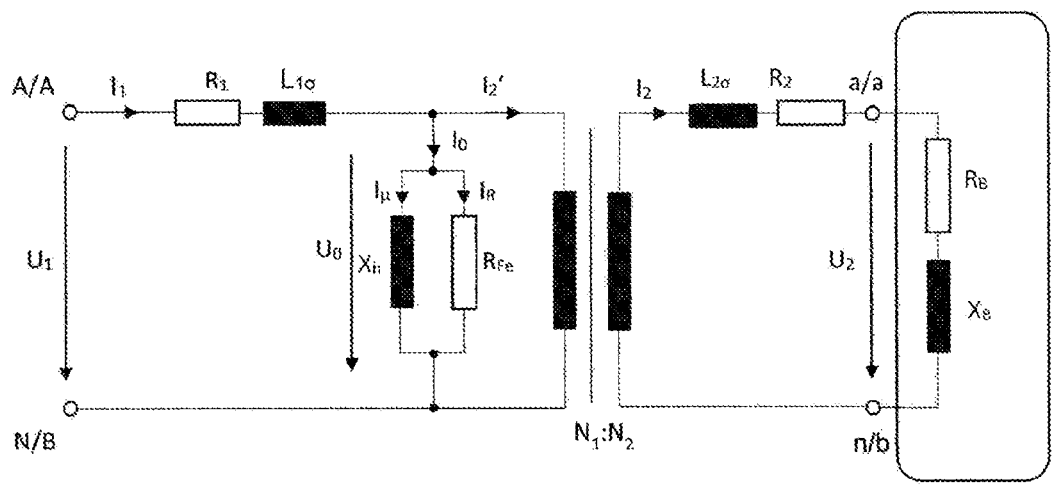
FIG. 6: shows a schematic representation of the electrical equivalent circuit diagram of a voltage converter.

FIG. 6 shows the electrical equivalent circuit diagram of a voltage converter (30) as used as the basis of a mathematical model of a voltage converter (30) in embodiments of a method according to the invention. In this case, $U_1$ denotes the primary voltage, $U_2$ denotes the secondary voltage and $U_0$ denotes the core voltage of the voltage converter (30). $I_1$ denotes the primary current, $I_2$ denotes the secondary current, $I_2'$ denotes the transformed primary current, $I_0$ denotes the magnetizing current, $I_\mu$ denotes the inductive component of the magnetizing current $I_0$ and $I_R$ denotes the ohmic component of the magnetizing current $I_0$. The primary terminals are marked A/A and N/B and the secondary terminals are marked a/a and n/b. $N_1$ indicates the number of primary turns and $N_2$ indicates the number of secondary turns of the voltage converter (30). The turns ratio of the voltage converter (30) is given by $N_1/N_2$. $L_{1\sigma}$ denotes the primary leakage inductances, $R_1$ denotes the primary winding resistance, $L_{2\sigma}$ denotes the secondary leakage inductances, $R_2$ denotes the secondary winding resistance, $X_B$ denotes the inductive component of the burden impedance, $R_B$ denotes the resistive component of the burden impedance, $X_H$ denotes the main inductance of the core, and $R_{Fe}$ denotes the resistance representing the iron losses of the voltage converter (30).

Figure 7:
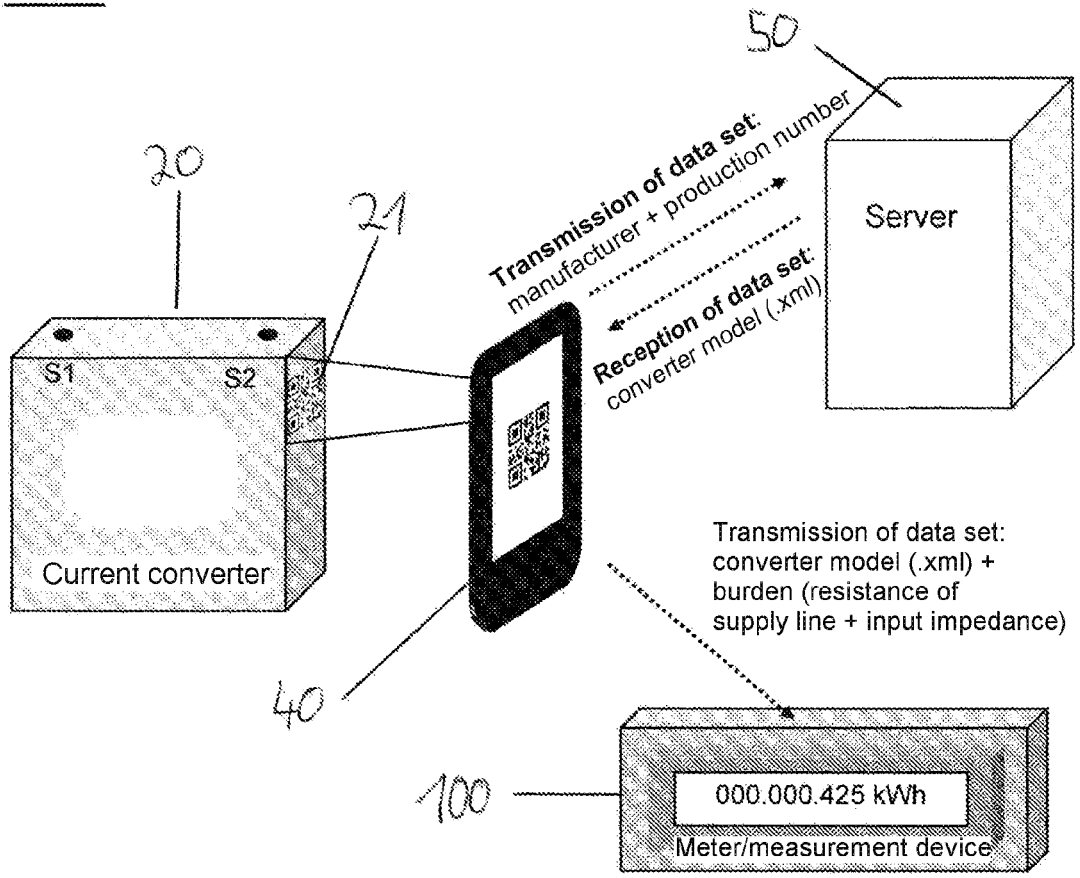
FIG. 7: shows a flow chart of a method according to the invention for measuring electric currents

FIG. 7 shows a schematic representation of the method steps for installing the mathematical model of a current converter (20) on an energy meter (100). The coding (21) applied to the current converter (20) is read out using a transmission apparatus (40), which is designed as a smartphone in the example. In the example, the coding (21) of the current converter (20) contains a manufacturer identification and a serial number of the current converter (20). The data relating to the current converter (20) read out using the transmission apparatus (40) are transmitted via an Internet connection to a server (50), from which the mathematical model of the corresponding current converter (20) is retrieved using the transmission apparatus (40). The mathematical model of the current converter (20) and/or the associated compensation tables are then transmitted from the transmission apparatus (40) to the energy meter (100) via a suitable interface and stored in a memory apparatus (6) of the energy meter (100).

Figure 8A:
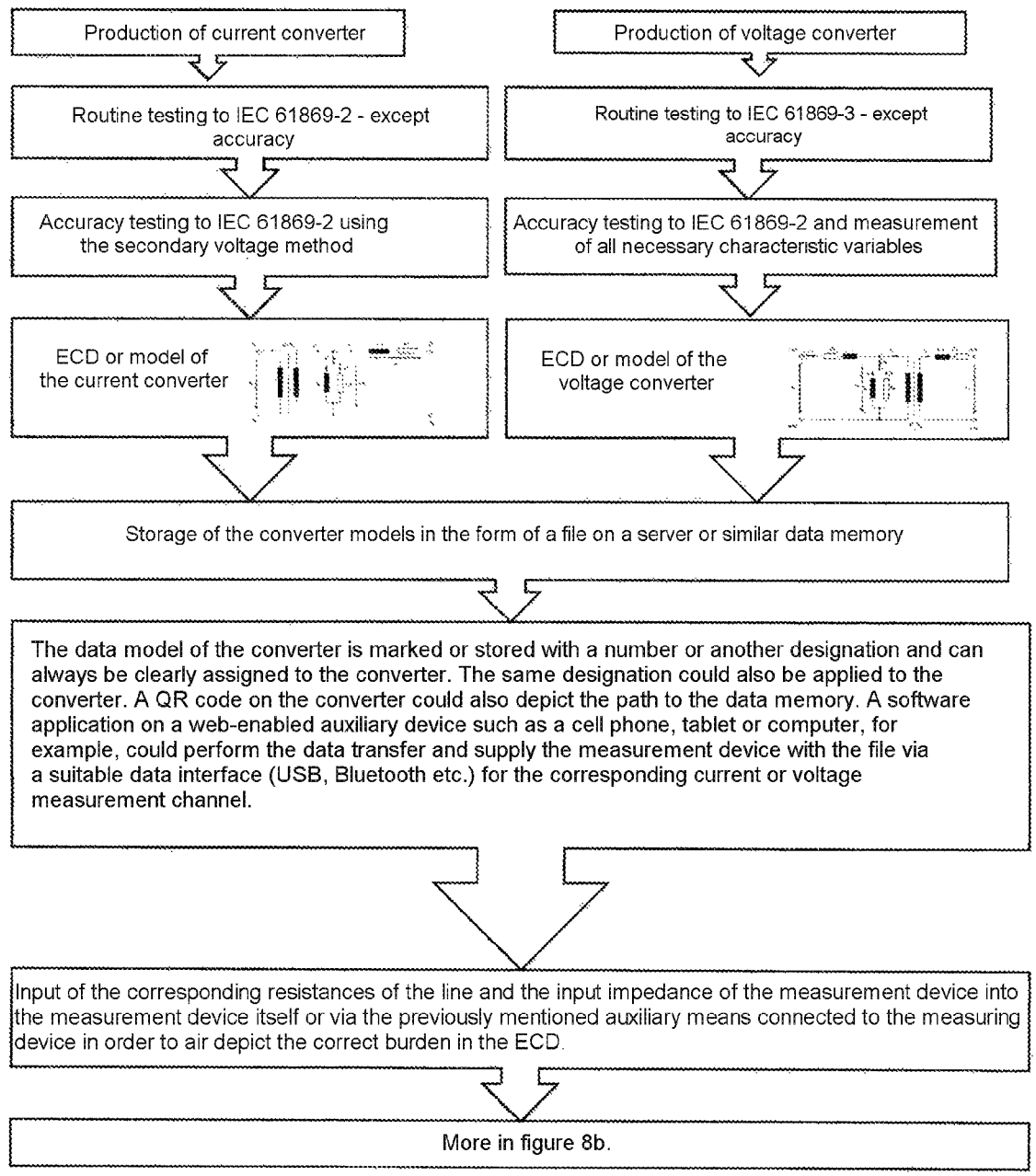

The sequence of a method according to the invention for the example of a compensation for a current converter (20) and a voltage converter (30) is shown schematically in FIGS. 8a and 8b. After the corresponding converters have been produced, mathematical models of the corresponding converters are generated using suitable measurements, which can be given, for example, by their electrical equivalent circuit diagrams. These mathematical models of the converters are stored in the form of a file on a server or a similarly accessible data memory. By coupling the mathematical models of the corresponding converters to the respective unambiguous designations, for example the serial number and/or a manufacturer identification, the mathematical models are correspondingly retrieved using suitable transmission apparatuses (40), which can be in the form of a smartphone, tablet or PC, for example. For this purpose, suitable software applications are installed on the corresponding transmission apparatuses (40) in embodiments of the invention. The model of the current and/or voltage converter retrieved using the transmission apparatus (40)

can then be transmitted to the measuring apparatus (1) using the transmission apparatus (40) via a suitable data interface, such as USB, Bluetooth, etc. In a particularly advantageous embodiment of the method according to the invention, the mathematical models of the current converter (20) and/or the voltage converter (30) are expanded by entering the corresponding resistances of the supply lines and the input impedance of the measuring apparatus (1) using the transmission apparatus (40) or at the measuring apparatus (1) itself in order to achieve increased accuracy of the compensation. The appropriately configured measuring apparatus (1) compensates for the secondary signal coming from the respective converter using the compensation unit (7) by using the respective compensation tables in terms of amplitude and/or phase. The compensated measured values are highly accurate in interaction with the electronics of the measuring apparatus (1). By compensating for the error effects caused by the converter, it is no longer absolutely necessary to use high-precision converters, with the result that correspondingly more cost-effective converters can be used. The accuracy of the measurement results ultimately depends on the accuracy of the mathematical models.

The invention claimed is:

1. A method for measuring electric currents, wherein a primary current flowing through a primary conductor is converted into a secondary current of smaller magnitude using an inductive current converter that has a primary side and a secondary side that is DC-isolated from the primary side, comprising the steps of: measuring the secondary current using a measuring apparatus; loading from a memory device at least one compensation table based on a mathematical model of the current converter for magnitude and/or phase of the measured secondary current or generating the at least one compensation table from the mathematical model of the current converter; using the at least one compensation table to at least partly compensate for a deviation of the measurement signal in magnitude and/or phase; and reconstructing a primary current flowing through the primary conductor based on the compensated secondary current, including reading out a type-related coding of the current converter connected to an energy meter or to be connected to said energy meter using a transmission apparatus, downloading the mathematical model of the respective current converter from a web server onto the transmission apparatus using the coding read out, transmitting the mathematical model of the respective current converter to the energy meter via an interface, and storing the mathematical model of the current converter in a memory device of the energy meter.

2. The method for measuring electric currents according to claim 1, wherein the mathematical model of the current converter is based on an electrical equivalent circuit diagram of the current converter.

3. The method for measuring electric currents according to claim 1, wherein the mathematical model of the current converter takes into account the actual burden on the current converter in terms of the input impedance of the measuring apparatus and/or line resistance of a line from the current converter to the measuring apparatus.

4. The method for measuring electric currents according to claim 1, wherein an error effect of the connected current converter is at least partly compensated for in an energy meter.

5. The method for measuring electric currents according to claim 1, including measuring the current on the secondary side of the current converter.

6. The method for measuring electric currents according to claim 1, wherein the mathematical model of the current converter is stored on the web server in a digital file.

7. The method for measuring electric currents according to claim 1, wherein the type-related coding of the current converter contains a download link for downloading the mathematical model or the compensation table of the current converter from the web server.

8. The method for measuring electric currents according to claim 1, including supplementing the mathematical model of the current converter using the transmission apparatus with an impedance of a line between the current converter and the energy meter and/or an input impedance of the measuring apparatus of the energy meter.

9. A method for measuring electric currents, wherein a primary current flowing through a primary conductor is converted into a secondary current of smaller magnitude using an inductive current converter that has a primary side and a secondary side that is DC-isolated from the primary side, comprising the steps of: measuring the secondary current using a measuring apparatus; loading from a memory device at least one compensation table based on a mathematical model of the current converter for magnitude and/or phase of the measured secondary current or generating the at least one compensation table from the mathematical model of the current converter; using the at least one compensation table to at least partly compensate for a deviation of the measurement signal in magnitude and/or phase; and reconstructing a primary current flowing through the primary conductor based on the compensated secondary current, including reading out a type-related coding of the current converter connected to an energy meter or to be connected to said energy meter using a transmission apparatus, downloading the mathematical model of the current converter from a web server onto a transmission apparatus using the coding read out, generating at least one compensation table from the mathematical model of the current converter using the transmission apparatus, transmitting the at least one compensation table to the energy meter via an interface, and storing the at least one compensation table in a memory device of the energy meter.

10. A method for measuring electric currents, wherein a primary current flowing through a primary conductor is converted into a secondary current of smaller magnitude using an inductive current converter that has a primary side and a secondary side that is DC-isolated from the primary side, comprising the steps of: measuring the secondary current using a measuring apparatus; loading from a memory device at least one compensation table based on a mathematical model of the current converter for magnitude and/or phase of the measured secondary current or generating the at least one compensation table from the mathematical model of the current converter; using the at least one compensation table to at least partly compensate for a deviation of the measurement signal in magnitude and/or phase; and reconstructing a primary current flowing through the primary conductor based on the compensated secondary current, including reading at a type-related coding of the current converter connected to an energy meter or to be connected to said energy meter using a transmission apparatus, accessing the mathematical model of the current converter on a web server using the coding read out, generating at least one compensation table from the mathematical model of the respective current converter on the web server, downloading the compensation table onto the transmission apparatus, transmitting the at least one compensation table from the transmission apparatus to the energy meter via an interface, and storing the at least one compensation table in a memory device of the energy meter.

11. A method for measuring electric currents, wherein a primary current flowing through a primary conductor is converted into a secondary current of smaller magnitude using an inductive current converter that has a primary side and a secondary side that is DC-isolated from the primary side, comprising the steps of: measuring the secondary current using a measuring apparatus; loading from a memory device at least one compensation table based on a mathematical model of the current converter for magnitude and/or phase of the measured secondary current or generating the at least one compensation table from the mathematical model of the current converter; using the at least one compensation table to at least partly compensate for a deviation of the measurement signal in magnitude and/or phase; and reconstructing a primary current flowing through the primary conductor based on the compensated secondary current, including reading out a type-related coding of the current converter connected to an energy meter or to be connected to said energy meter out using a transmission apparatus, accessing the mathematical model of the current converter on a PC or selecting the mathematical model on the transmission apparatus using the coding read out, generating at least one compensation table is generated from the mathematical model of the respective current converter on the PC, and downloading the at least one compensation table onto the transmission apparatus or generating the compensation table from the mathematical model selected on the transmission apparatus, transmitting the at least one compensation table from the transmission apparatus to the energy meter via an interface, and storing the at least one compensation table in a memory device of the energy meter.

12. A method for measuring electrical voltages, wherein a primary voltage applied to a primary conductor is converted into a secondary voltage of smaller magnitude using an inductive voltage converter that has a primary side and a secondary side that is DC-isolated from the primary side, comprising the steps of: measuring the secondary voltage using a measuring apparatus; loading at least one compensation table based on a mathematical model of the voltage converter for magnitude and/or phase of the measured secondary voltage from a memory device or generating the at least one compensation table from the mathematical model of the voltage converter; using the at least one compensation table to at least partly compensate for a deviation of the measurement signal in magnitude and/or phase; and reconstructing a primary voltage applied to the primary conductor based on the compensated secondary voltage, including reading out a type-related coding of the voltage converter connected to an energy meter or to be connected to said energy meter using a transmission apparatus, downloading a mathematical model of the voltage converter from a web server onto the transmission apparatus using the coding read out, transmitting the mathematical model of the respective voltage converter to the energy meter via an interface, and storing the mathematical model of the voltage converter in a memory device of the energy meter.

13. The method for measuring electric voltages according to claim 12, wherein the mathematical model of the voltage converter is based on an electrical equivalent circuit diagram of the voltage converter.

14. The method for measuring electric voltages according to claim 12, wherein the mathematical model of the voltage converter takes into account an actual burden on the voltage converter in terms of an input impedance of the measuring apparatus and/or line resistance of a line from the voltage converter to the measuring apparatus.

15. The method for measuring electric voltages according to claim 12, wherein an error effect of the connected voltage converter is at least partly compensated for in an energy meter.

16. The method for measuring electric voltages according to claim 12, including measuring voltage on the secondary side of the voltage converter.

17. The method for measuring electric voltages according to claim 12, wherein the mathematical model of the voltage converter is stored on the web server in a digital file.

18. The method for measuring electric voltages according to claim 12, wherein the type-related coding of the voltage converter contains a download link for downloading the mathematical model or the compensation table of the current converter from a web server.

19. The method for measuring electric voltages according to claim 12, including supplementing the mathematical model of the voltage converter using the transmission apparatus with an impedance of a line between the voltage converter and the energy meter and/or an input impedance of the measuring apparatus of the energy meter.

20. A method for measuring electrical voltages, wherein a primary voltage applied to a primary conductor is converted into a secondary voltage of smaller magnitude using an inductive voltage converter that has a primary side and a secondary side that is DC-isolated from the primary side, comprising the steps of: measuring the secondary voltage using a measuring apparatus; loading at least one compensation table based on a mathematical model of the voltage converter for magnitude and/or phase of the measured secondary voltage from a memory device or generating the at least one compensation table from the mathematical model of the voltage converter; using the at least one compensation table to at least partly compensate for a deviation of the measurement signal in magnitude and/or phase; and reconstructing a primary voltage applied to the primary conductor based on the compensated secondary voltage, including reading out a type-related coding of the voltage converter connected to an energy meter or to be connected to said energy meter using a transmission apparatus, downloading a mathematical model of the respective current converter from a web server onto the transmission apparatus using the coding read out, generating at least one compensation table from the mathematical model of the respective voltage converter using the transmission apparatus, transmitting the at least one compensation table to the energy meter via an interface, and storing the at least one compensation table in a memory device of the energy meter.

21. A method for measuring electrical voltages, wherein a primary voltage applied to a primary conductor is converted into a secondary voltage of smaller magnitude using an inductive voltage converter that has a primary side and a secondary side that is DC-isolated from the primary side, comprising the steps of: measuring the secondary voltage using a measuring apparatus; loading at least one compensation table based on a mathematical model of the voltage converter for magnitude and/or phase of the measured secondary voltage from a memory device or generating the at least one compensation table from the mathematical model of the voltage converter; using the at least one compensation table to at least partly compensate for a deviation of the measurement signal in magnitude and/or phase; and reconstructing a primary voltage applied to the primary conductor based on the compensated secondary voltage, including reading out a type-related coding of the voltage converter connected to an energy meter or to be connected to said energy meter using a transmission apparatus, accessing a mathematical model of the respective voltage converter on a web server using the coding read out, generating at least one compensation table from the mathematical model of the respective voltage converter on the web server, downloading compensation table onto the transmission apparatus, transmitting the at least one compensation table from the transmission apparatus to the energy meter via an interface, and storing the at least one compensation table in a memory device of the energy meter.

22. A method for measuring electrical voltages, wherein a primary voltage applied to a primary conductor is converted into a secondary voltage of smaller magnitude using an inductive voltage converter that has a primary side and a secondary side that is DC-isolated from the primary side, comprising the steps of: measuring the secondary voltage using a measuring apparatus; loading at least one compensation table based on a mathematical model of the voltage converter for magnitude and/or phase of the measured secondary voltage from a memory device or generating the at least one compensation table from the mathematical model of the voltage converter; using the at least one compensation table to at least partly compensate for a deviation of the measurement signal in magnitude and/or phase; and reconstructing a primary voltage applied to the primary conductor based on the compensated secondary voltage, including reading out a type-related coding of the voltage converter connected to an energy meter or to be connected to said energy meter using a transmission apparatus, accessing a mathematical model of the respective voltage converter is accessed on a PC or selecting the mathematical model on the transmission apparatus using the coding read out, generating at least one compensation table is generated from the mathematical model of the respective voltage converter on the PC, downloading the at least one conservation table onto the transmission apparatus or generating the at least one compensation table from the mathematical model selected on the transmission apparatus, transmitting the at least one compensation table from the transmission apparatus to the energy meter via an interface, and storing the at least one compensation table in a memory device of the energy meter.

* * * * *